(12) United States Patent
Rosman

(10) Patent No.: US 7,694,068 B1
(45) Date of Patent: *Apr. 6, 2010

(54) RE-ENTRANT PROCESSING IN A CONTENT ADDRESSABLE MEMORY

(75) Inventor: Andrew Rosman, Palo Alto, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 947 days.

This patent is subject to a terminal disclaimer.

(21) Appl. No.: 11/298,206

(22) Filed: Dec. 8, 2005

(51) Int. Cl.
*G06F 12/00* (2006.01)
*G11C 15/00* (2006.01)

(52) U.S. Cl. .................... 711/108; 365/49.17
(58) Field of Classification Search .............. None
See application file for complete search history.

(56) References Cited

U.S. PATENT DOCUMENTS

| | | | |
|---|---|---|---|
| 5,414,704 A | 5/1995 | Spinney | |
| 5,438,535 A | 8/1995 | Lattibeaudiere | |
| 5,574,910 A | 11/1996 | Bialkowski et al. | |
| 6,018,524 A | 1/2000 | Turner et al. | |
| 6,154,384 A | 11/2000 | Nataraj et al. | |
| 6,192,051 B1 | 2/2001 | Lipman et al. | |
| 6,215,816 B1 | 4/2001 | Gillespie et al. | |
| 6,223,172 B1 | 4/2001 | Hunter et al. | |
| 6,307,855 B1 | 10/2001 | Hariguchi | |
| 6,374,326 B1 | 4/2002 | Kansal et al. | |
| 6,385,649 B1 | 5/2002 | Draves et al. | |
| 6,546,391 B1 | 4/2003 | Tsuruoka | |
| 6,571,313 B1 | 5/2003 | Filippi et al. | |
| 6,735,600 B1 | 5/2004 | Andreev et al. | |
| 6,792,502 B1* | 9/2004 | Pandya et al. | 711/108 |
| 6,906,936 B1 | 6/2005 | James et al. | |
| 6,963,924 B1 | 11/2005 | Huang et al. | |
| 7,162,481 B2 | 1/2007 | Richardson et al. | |
| 7,194,573 B1* | 3/2007 | Saxtorph et al. | 711/108 |
| 7,249,228 B1 | 7/2007 | Agarwal et al. | |
| 7,266,085 B2 | 9/2007 | Stine | |
| 7,299,399 B2 | 11/2007 | Huang | |
| 7,313,666 B1 | 12/2007 | Saminda De Silva et al. | |
| 7,339,810 B1* | 3/2008 | Smith | 365/49.1 |
| 7,555,593 B1* | 6/2009 | Rosman | 711/108 |
| 2002/0089937 A1 | 7/2002 | Venkatachary et al. | |

OTHER PUBLICATIONS

A Fast and Scalable IP Lookup Scheme for High-Speed Networks, Chen et al., © 1999 IEEE, pp. 211-218.

(Continued)

*Primary Examiner*—Denise Tran
(74) *Attorney, Agent, or Firm*—Mahamedi Paradice Kreisman LLP; William L. Paradice, III

(57) ABSTRACT

A processing system includes a network processor and a CAM device having a re-entrant processor coupled to a CAM array. The re-entrant processor is configured to selectively modify an initial search key provided by the network processor by replacing portions of the initial search key with portions of one or more previous search keys and/or one or more previous results. The re-entrant processor is also configured to initiate a series of subsequent compare operations between new search keys and data stored in the CAM array without receiving additional instructions or search keys from the network processor.

25 Claims, 9 Drawing Sheets

OTHER PUBLICATIONS

Efficient hardware Architecture for Fast IP Address Lokup, Pao et al., IEEE INFOCOM 2002, pp. 555-561.

Fast Address lookups using controlled Prefix Expansion, Venkatachary Srinivasan et al., ACM Transactions on Computer Systems, vol. 17., No. 1, Feb. 1999, pp. 1-40.

Fast and Scalable Layer 4 Switching, V. Srinivasan, G Varghese, S. Suri and M. Waldvogel, Presented at ACM Sigcomm '98, 18 page slide presentation.

Forwarding Engine for Fast Routing Lookups and Updates, Yu et al., 1999 Gobal Telecommunications Conference, pp. 1556-1564.

Gupta, "Algorithms for routing Lookups and packet Classification," Dec. 2000, pp. 1-197.

International Search Report, PCT/US2004/009531, Mailed Sep. 2, 2004.

Lampson et al., "IP Lookup using Multiway and Multicolumn Search," Aug. 1997, pp. 1-23.

Packet Classification using hierarchical Intelligent Cuttings, Pankaj Gupta and Nick McKeown, Proc. Hot Interconnects VII, Aug. 1999, Stanford University.

Packet Classification on Multiple Fields, Pankj Gupta and Nick McKeown, Proc. Sigcomm, Computer Communication Review, vol. 29, No. 4, pp. 147-60, Sep. 1999 Harvard University.

Reconfigurable memory Architecture for Scalable IP Forwarding Engines, Akhbarizadeh et al., © 2002 IEEE, pp. 432-437.

Non-Final Office Action for U.S. Appl. No. 10/866,353, filed Jun. 11, 2004; Office Action mailed Sep. 22, 2009, 25 pages.

U.S. Appl. No. 10/866,353, filed Jun. 11, 2004, Srinivasan, V.

Final Office Action mailed Feb. 15, 2007 in U.S. Appl. No. 10/866,353 14 pages.

Final Office Action mailed Jun. 18, 2008 in U.S. Appl. No. 10/866,353 19 pages.

Final Office Action mailed Apr. 7, 2009 in U.S. Appl. No. 10/866,353 22 pages.

Non-Final Office Action mailed Aug. 15, 2006 in U.S. Appl. No. 10/866,353 12 pages.

Non-Final Office Action mailed Aug. 9, 2007 in U.S. Appl. No. 10/866,353 19 pages.

Non-Final Office Action mailed Dec. 5, 2008 in U.S. Appl. No. 10/866,353 20 pages.

* cited by examiner

RE-ENTRANT PROCESSING IN A CONTENT ADDRESSABLE MEMORY

FIELD OF INVENTION

The present invention relates generally to content addressable memories, and more specifically increasing the bandwidth of a content addressable memory in a network processing environment.

DESCRIPTION OF RELATED ART

A content addressable memory (CAM) device is a storage device having an array of memory cells that can be instructed to compare the specific pattern of a search key (also referred to as comparand data or a comparand word) with data words stored in rows of the array. The entire CAM array, or segments thereof, may be searched in parallel for a match with the comparand data. If a match exists, the CAM device indicates the match condition by asserting a match flag, and may indicate the existence of multiple matches by asserting a multiple match flag. The CAM device typically includes a priority encoder that determines the highest priority matching address (e.g., the lowest matching CAM index). The highest priority matching address (HPM), the contents of the matched location, and other status information (e.g., skip bit, empty bit, full flag, as well as match and multiple match flags) may be output from the CAM device to an output bus. In addition, associative data may be read out from an associated memory device such as DRAM.

CAM devices are often used in network processing applications to perform various look-up functions such as, for example, next-hop address forwarding, quality of service (QoS) enforcement, packet classification, ATM searches, and so on. For example, FIG. 1 shows a network processing system 100 having a network processor 110 and a CAM system 120 including a CAM device 121 and an associated memory device 123. Network processor 110, which is well-known, includes a first port coupled to the physical or media access controller (PHY/MAC) layer of an associated network such as the Internet (not shown for simplicity), and a second port coupled to CAM system 120 via signal lines 101. CAM device 121, which is well-known, includes a CAM core 122 having an array of CAM cells for storing a plurality of data words. Memory device 123, which is well-known, is connected to CAM device 121 via signal lines 102 and includes an array of memory cells such as DRAM cells for storing associated data for CAM device 121. For example, in some applications, the array of CAM cells in CAM device 121 may store next-hop CIDR addresses, and the array of DRAM cells in memory device 123 may store routing information (e.g., such as policy statements) associated with the CIDR addresses.

In operation, network processor 110 receives a packet having a header and a payload from the PHY/MAC layer. The payload typically includes data to be routed across the network, and the header typically includes a source address, a destination address, and other routing information such as QoS and/or policy parameters. Network processor 110 stores the payload, extracts the destination address from the header, and generates a search key (KEY) from the destination address. Then, network processor 110 provides KEY and an instruction (INST) to CAM system 120. The instruction is decoded in CAM device 121 to initiate a well-known compare operation between KEY and the data words stored in the CAM core's array. If there is a match, CAM core 122 outputs the index (IDX) of the highest priority matching location to memory device 123, which in turn uses IDX as an address to retrieve associated data (DOUT), which may be provided to network processor 110. Network processor 110 may use DOUT, for example, to route the corresponding packet to a next-hop location in the network.

In network processing applications, it is often desired to perform a series of related (e.g., dependent) searches in CAM device 121. For example, the results of a first compare operation between a first search key and the data stored in CAM core 122 may be used to generate a second key to be used in a second compare operation with the data words stored in CAM core 122. Typically, the results of the first compare operation retrieved from memory device 123 are provided to network processor 110 via signal lines 101, which in response thereto generates the second key and then provides the second key and an associated instruction to CAM device 121 via signal lines 101 to initiate the second compare operation between the second key and the data words stored in CAM core 122. Thus, although the second compare operation may be dependent upon the results of the first compare operation, the two compare operations are independently initiated in response to separate sets of search keys and instructions provided to CAM device 121 by network processor 110. Accordingly, each search in a series of related searches requires a number of separate processor execution cycles in network processor 110 (e.g., to generate subsequent keys in response to previous keys and/or results), and also requires the communication of a separate search key and instruction from network processor 110 to CAM device 121 via signal lines 101, as well as the communication of search results from memory device 123 to network processor 110 via signal lines 101.

As the through-put demand of network processors increases, the processing capability of network processor 110 and the bandwidth of the signal lines 101 between network processor 110 and CAM system 120 become more important. Thus, there is a need to reduce the processing time of network processor 110 and the internal bandwidth requirements between network processor 110 and CAM system 120 when system 100 is performing a series of related searches.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for performing a series of related searches in a network processing system are described below with respect to an exemplary CAM device for simplicity only. Indeed, embodiments of the present invention are equally applicable to other CAM architectures. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, the logic states of various signals described herein are exemplary and therefore may be reversed or otherwise modified as generally known in the art.

In a network processing system including a network processor, a CAM device, and an associated memory device, embodiments of the present invention may reduce the processing time of the network processor and the internal bandwidth requirements between the network processor and the CAM device when the CAM device is performing a series of related search or compare operations. For some embodiments, the CAM device includes an array of CAM cells and a re-entrant processor. The CAM array stores a plurality of data words that may be compared with a search key during search operations. The re-entrant processor is configured to selectively modify the search key to construct a new search key using data such as search keys and/or search results from one or more previous search operations, and is also configured to initiate a series of subsequent compare operations between one or more new keys and data stored in the CAM array without receiving additional search keys or instructions from the network processor. In this manner, embodiments of the present invention may perform a series of related compare operations in the CAM array without utilizing any execution cycles of the network processor and without consuming any bandwidth of signal line interconnections between the network processor and the CAM device.

Figure 1:
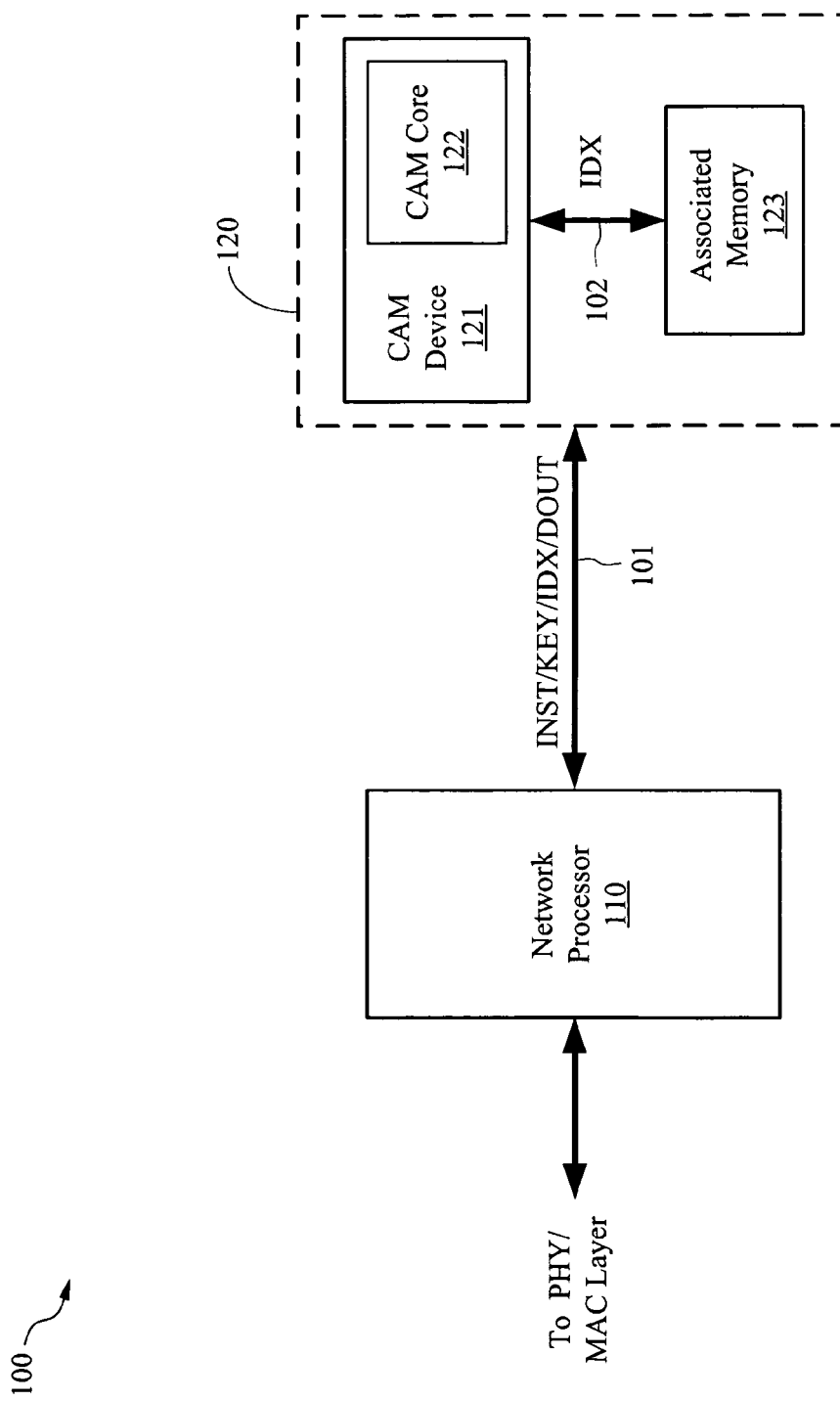
FIG. 1 is a block diagram of a network processing system.
Figure 2:
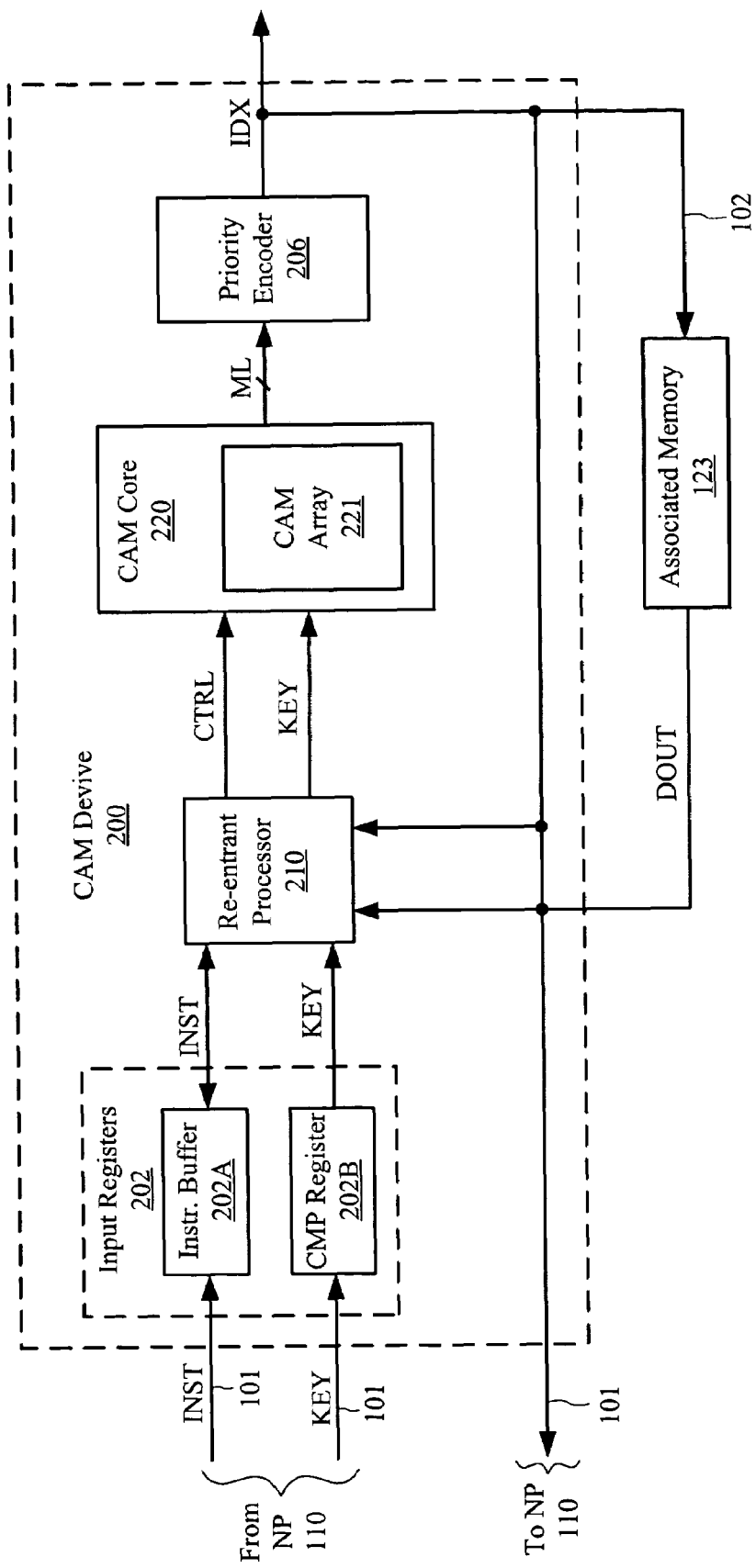
FIG. 2 is a simplified functional block diagram of a CAM device in accordance with some embodiments of the present invention.

FIG. 2 shows an exemplary embodiment of a CAM device 200 in accordance with the present invention. CAM device 200 includes an input register circuit 202 having an instruction buffer 202A and a comparand register 202B, a priority encoder 206, a re-entrant processor 210, and a CAM core 220, and is shown to have input and output connections to associated memory device 123. As mentioned above, memory device 123, which is well-known, stores associated data for CAM device 200. Instruction buffer 202A, which is well-known, includes one or more storage locations for storing one or more instructions (INST) received from a network processor such as network processor 110 of FIG. 1, and includes an output coupled to re-entrant processor 210. Comparand register 202B, which is well-known, includes one or more storage locations for storing one or more search keys or comparand words (KEY) received from network processor 110, and includes an output coupled to re-entrant processor 210.

CAM core 220 has inputs coupled to re-entrant processor 210, and includes a CAM array 221 having any number of rows of CAM cells (not shown in FIG. 2 for simplicity). Each row of CAM cells is coupled to a corresponding match line ML, and may be used to store a corresponding data word. For some embodiments, each row of CAM cells may store a validity bit (not shown for simplicity) that indicates whether valid data is stored therein. The CAM cells in CAM array 221 may be any suitable type of CAM cell such as, for example, synchronous CAM cells, asynchronous CAM cells, binary CAM cells, ternary CAM cells, and/or quaternary CAM cells. CAM array 221 can be of any suitable size and/or configuration, and for some embodiments may include inter-row configurability features that allow storage of data words of varying lengths (e.g., words that are stored in more than one row and/or data words that are stored in a portion of a row), for example, as described in commonly owned U.S. Pat. Nos. 6,799,243 and 6,934,795, the entireties of which are incorporated herein by reference. Although not shown in FIG. 2 for simplicity, CAM array 221 may be divided into a plurality of separate, individually selectable CAM blocks, for example, as described in commonly owned U.S. Pat. Nos. 6,324,087, 6,687,785, and 6,763,425, the entireties of which are incorporated herein by reference.

Further, although not shown for simplicity, CAM core 220 may include other well-known components such as an address decoder, a read/write circuit, and a global mask circuit. The address decoder may include an input to receive an address for read and write operations to CAM array 221, and may include outputs coupled to the rows (i.e., via corresponding word lines) of CAM cells in CAM array 221. The read/write circuit may includes terminals coupled to corresponding columns of CAM cells in CAM array 221, and may include write drivers to write data to the CAM array and include sense amplifiers to read data from the CAM array. The global mask circuit may store one or more mask patterns that selectively mask the search key during compare operations with data words stored in the CAM array.

For other embodiments, CAM core 220 may be replaced by other well-known circuitry that is capable of implementing search operations associated with network routing applications. For example, for another embodiment, CAM core 220 may be replaced by circuitry configured to implement well-known hashing functions.

The match lines ML provide match results for compare operations between the search key and data words stored in CAM array 110 to priority encoder 206. In response thereto, priority encoder 206 determines the matching entry that has the highest priority number associated with it and generates the index or address of this highest priority match (IDX). In addition, priority encoder 206 may use the validity bits from CAM array 221 to generate the next free address (NFA) that is available in CAM array 221 for storing new data.

Re-entrant processor 210 includes first inputs to receive INST from instruction buffer 202A and to receive KEY from comparand register 202B, includes second inputs to receive IDX from priority encoder 206 and to receive DOUT from associated memory device 123, and includes outputs to provide search keys and related control signals (CTRL) to CAM core 220. IDX and DOUT may be provided from CAM device 200 to network processor 110 via signal lines 101. Although not shown in FIG. 2 for simplicity, CAM device 200 may include logic that selectively returns IDX, DOUT, and/or some combination of IDX and DOUT to network processor 110. In accordance with the present invention, re-entrant processor 210 is configured to initiate any number of related search operations in CAM array 221 in response to a single instruction and a single search key received from network processor 110. Re-entrant processor 210 is also configured to modify the search key, for example, by constructing a new search key using portions of one or more previous search keys and/or portions of one or more previous search results. In this manner, a series of related (i.e., dependent) compare operations may be performed in CAM device 200 in response to a single search key/instruction set provided by network processor 110 (e.g., without receiving additional data from network processor 110), thereby reducing the number of processor execution cycles of network processor 110 and reducing the bandwidth requirements between network processor 110 and CAM device 200, for example, as compare to prior techniques.

Although not shown for simplicity, CAM device 200 may also include match logic coupled to the match lines of CAM array 221. As known in the art, the match logic may generate a match flag indicating whether a match condition exists, a multiple match flag indicating whether multiple matches exist, and a full flag indicating whether any storage locations in CAM array 221 are available for storing new data. Further, other well-known signals that can be provided to CAM device 200, such as enable signals, clock signals, and power connections, are not shown for simplicity.

For some embodiments, CAM device 200 and associated memory 123 may be formed as separate IC chips. For other embodiments, CAM device 200 and associated memory 123 may be formed on the same IC chip.

Figure 3:
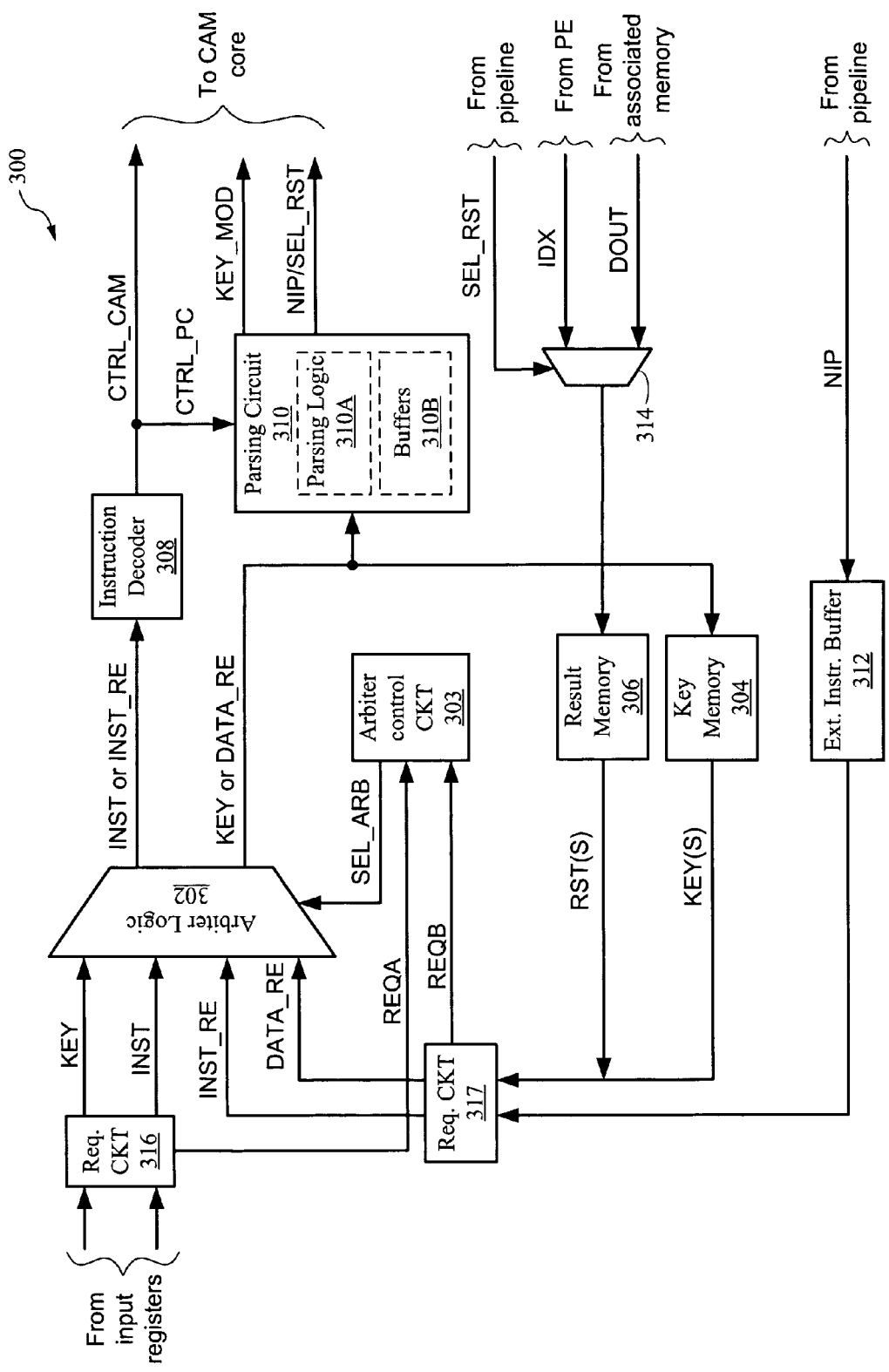
FIG. 3 is a functional block diagram of an exemplary embodiment of the re-entrant processor of FIG. 2.

FIG. 3 shows a functional block diagram of a re-entrant processor 300 that is one embodiment of re-entrant processor 210 of FIG. 2. Re-entrant processor 300 includes a number of functional blocks including arbiter logic 302, an arbiter control circuit 303, a key memory 304, a result memory 306, an instruction decoder 308, a parsing circuit 310, an extended instruction buffer 312, a multiplexer (MUX) 314, and request circuits 316-317. It is to be noted that the specific layout of components depicted in FIG. 3 is merely illustrative and is referenced below for explaining operation of an exemplary embodiment of re-entrant processor 210. Thus, for other embodiments, the various components of re-entrant processor 300 may be arranged in other configurations, and/or may include other suitable components to implement the re-entrant search and key modification functions described below.

Arbiter logic 302 includes a first input to receive an instruction (INST) from instruction buffer 202A, a second input to receive KEY from comparand register 202B, a third input to receive a re-entrant instruction (INST_RE), a fourth input to receive re-entrant data (DATA_RE), a control terminal to receive an arbiter select signal (SEL_ARB) from arbiter control circuit 303, a first output to provide either INST or INST_RE to instruction decoder 308, and a second output to provide either KEY or DATA_RE to parsing circuit 310. Arbiter control circuit 303 includes a first input to receive a request REQA from request circuit 316, and a second input to receive a request REQB from request circuit 317. Request circuits 316-317 are well-known. When KEY and INST are received from network processor 110, request circuit 316 buffers KEY and INST and makes a request to arbiter control circuit 303 by asserting REQA (e.g., to logic high). Similarly, when DATA_RE and INST_RE are received from the pipeline, request circuit 317 buffers DATA_RE and INST_RE and makes a request to arbiter control circuit 303 by asserting REQB (e.g., to logic high).

Arbiter control circuit 303 may use any suitable arbitration technique (e.g., such as fixed, round robin, weighed fair queuing, and so on) to generate SEL_ARB in response to requests REQA and REQB, where the state of SEL_ARB determines whether arbiter logic 302 forwards network data (e.g., instructions and/or keys from network processor 110) or re-entrant data (e.g., re-entrant instructions and/or keys) to the CAM core pipeline. For some embodiments, arbiter control circuit 303 may be configurable (e.g., by a network administrator) to select one of a multitude of arbitration techniques. For one embodiment, a feedback signal (not shown for simplicity) may cause arbiter control circuit 303 to drive SEL_ARB to a desired state, for example, in response congestion in the CAM core pipeline to halt instruction execution.

Instruction decoder 308, which is well-known, decodes the instruction received from arbiter logic 302 to generate a number of CAM control signals (CTRL_CAM) that may initiate various read, write, compare, test, and other well-known operations in CAM core 220, and to generate a number of parsing control signals CTRL_PC for use by parsing circuit 310. Extended instruction buffer 312, which includes an input to receive a next instruction pointer (NIP) from the CAM core's pipeline, has an output coupled to the third input of arbiter logic 302 and includes a plurality of storage locations for storing a number of re-entrant instructions (INST_RE). For some embodiments, the storage locations in instruction buffer 202 and the storage locations in extended instruction buffer 312 occupy consecutive address spaces. For other embodiments, the storage locations in extended instruction buffer 312 may be memory mapped to corresponding storage locations instruction buffer 202.

Key memory 304, which has a first input to receive KEY from arbiter logic 302 and an output coupled to request circuit 317, includes a plurality of storage locations for storing a number of search keys from current and previous compare operations in CAM array 221. For other embodiments, key memory 304 may receive KEY from the CAM core's pipeline. Result memory 306, which has an input coupled to an output of MUX 314 and an output coupled to request circuit 317, includes a plurality of storage locations for storing a number of results (RST) from the current and previous compare operations in CAM array 221. Referring also to FIG. 2, MUX 314 has a first input to receive IDX from priority encoder 206, a second input to receive DOUT from associated memory device 123, and a control terminal to receive a result select signal (SEL_RST) from the CAM core's pipeline. Together, a key or keys read from search memory 304 and a result or results read from result memory 306 form the re-entrant data (DATA_RE) provided to the fourth input of arbiter logic 302.

Memories 304 and 306 may include any suitable type of memory elements. For some embodiments, memories 304 and 306 may be FIFO memories, although for other embodiments other types of memory may be used. For one embodiment, search memory 304 and result memory 306 may be the same memory. For other embodiments, search memory 304 and result memory 306 may be replaced by a context buffer that stores a plurality of individually addressable key/result pairs, for example, as described below with respect to FIG. 7.

Parsing circuit 310, which includes parsing logic 310A and a plurality of data buffers 310B, has a first input to receive CTRL_PC from instruction decoder 308, a second input to receive either KEY or DATA_RE from arbiter logic 302, a first output to provide either KEY or a modified search key (KEY_MOD) to CAM core 220, and a second output to provide NIP and SEL_RST to the CAM core's pipeline. In accordance with some embodiments of the present invention, parsing circuit 310 may be used to initiate a series of re-entrant search operations in CAM core 220 in response to a single instruction and search key provided to CAM device 200 by network processor 110. For some embodiments, parsing circuit 310 may also use portions of one or more search keys and/or associated results from one or more previous compare operations in CAM core 220 to construct KEY_MOD.

For example, for some embodiments, an initial instruction provided to CAM device 200 from network processor 110 may include control signals for initiating a compare operation between KEY and data stored in CAM array 221, key definition data that defines if and how KEY is to be modified to form KEY_MOD, and control data that defines how one or more subsequent search operations may be initiated in CAM core 220 without receiving additional instructions or data from network processor 110 (e.g., using re-entrant instructions stored in extended instruction buffer 312).

Figure 4A:
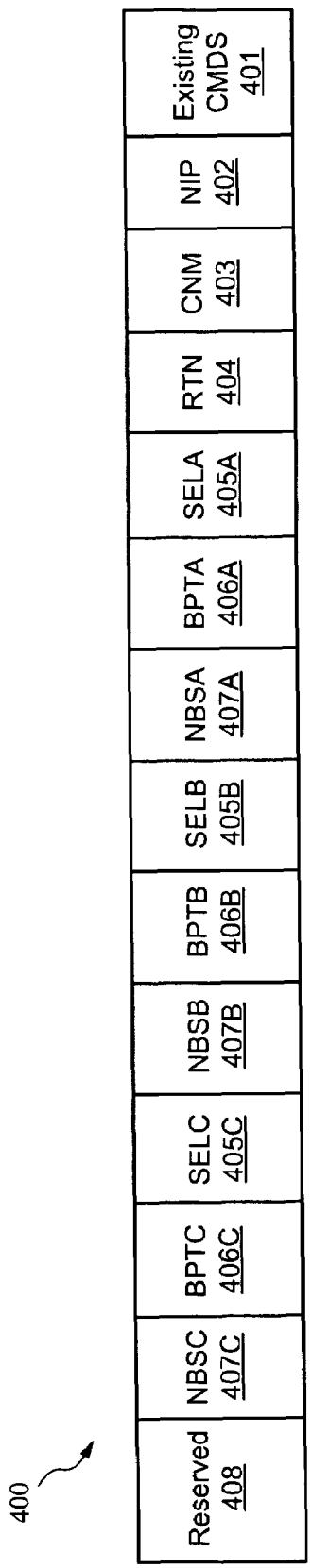
FIG. 4A shows an exemplary re-entrant instruction in accordance with the present invention.

FIG. 4A shows an illustrative re-entrant instruction (INST_RE) 400 that may be used to initiate re-entrant search operations in accordance with some embodiments of the present invention. INST_RE 400 includes a command field 401, re-entrant enabling fields 402-403, a return code field 404, three sets of key construction fields 405A-407A, 405B-407B, and 405C-407C, and a reserved field 408. Although the exemplary instruction 400 is shown to include three sets of key construction fields 405A-407A, 405B-407B, and 405C-407C, it is to be understood that other instructions suitable for use by re-entrant processor 300 may contain other numbers of key construction field sets.

Command field 401 stores commands (CMDS) such as well-known op-codes that may be used to initiate write operations to CAM array 221, initiate read operations from CAM array 221, initiate compare operations between a search key and data stored in CAM array 221, initiate test operations for CAM array 221, and so on.

Enabling fields 402-403 determine whether another re-entrant instruction referred to by instruction 400 is to be executed by re-entrant processor 300. For example, field 402 contains a next instruction pointer (NIP) that points to the next instruction stored in extended instruction buffer 312 that is to be executed by CAM device 200. For some embodiments, the NIP may be set to a predetermined address value to cause parsing circuit 310 to terminate the execution of re-entrant search operations. Thus, for non re-entrant instructions, NIP is set to the predetermined value so that CAM device 200 does not initiate a subsequent compare operation unless a subsequent instruction is received from network processor 110. Field 403 contains a Continue-on No Match (CNM) bit that indicates whether re-entrant processor 300 continues execution of re-entrant searches if there is a mismatch condition in the current compare operation. For example, if CNM is asserted (e.g., to logic high), the next instruction identified by the NIP in the current instruction is executed regardless of the match results of the current instruction, and conversely, if CNM is de-asserted (e.g., to logic low), re-entrant processor 300 terminates execution of the re-entrant search operations if there is a mismatch condition in the current compare operation.

Field 404 contains a return code RTN that determines whether results of a compare operation are to be immediately returned to network processor 110 and/or are to be stored in CAM device 200. For example, if RTN is asserted (e.g., to logic high), the compare results may be returned to network processor 110 immediately after the compare operation. Conversely, if RTN is de-asserted (e.g., to logic low), the compare results may be buffered for subsequent output to network processor 110, for example, after a series of re-entrant instructions are processed in CAM core 220.

Figure 4B:
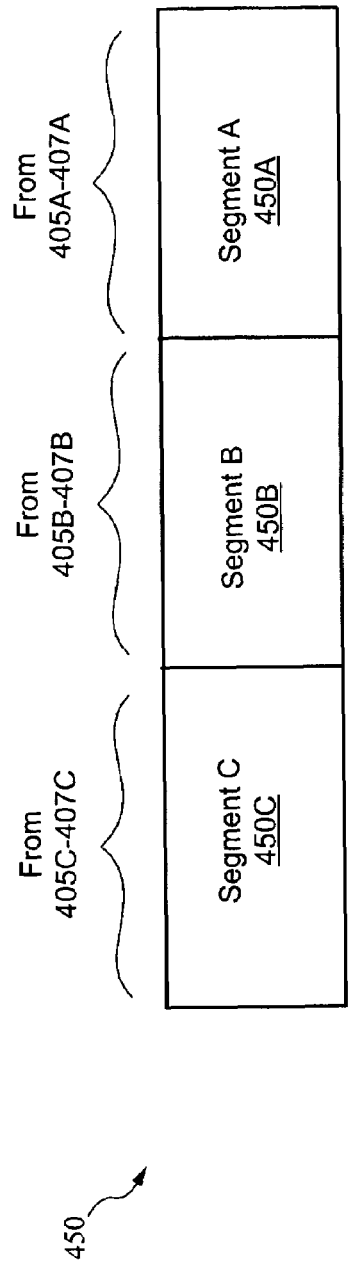
FIG. 4B shows an exemplary re-entrant search key generated in response to the re-entrant instruction of FIG. 4A.

Key construction fields 405A-407A, 405B-407B, and 405C-407C define how segments 450A, 450B, and 450C, respectively, of an exemplary KEY_MOD 450 shown in FIG. 4B are formed using data from one or more previous compare operations. For example, field 405A contains select bits (SELA) that select either a previous search key or a previous search result as source data to form the first segment 450A of KEY_MOD. Field 406A contains a first byte pointer (BPTA) that points to the first byte in the source data selected by SELA. Field 407A contains bits indicating the number of bytes (NBSA) of the selected source data that are to be used to form first segment 450A of KEY_MOD. Together, fields 406A and 407A form a key definition set that identifies which portion of the source data selected by SELA will form the first segment of KEY_MOD.

Field 405B contains select bits (SELB) that select either a previous search key or a previous search result as source data to form the second segment 450B of KEY_MOD. Field 406B contains a first byte pointer (BPTB) that points to the first byte in the source data selected by SELB. Field 407B contains bits indicating the number of bytes (NBSB) of the selected source data that are to be used to form second segment 450B of KEY_MOD. Together, fields 406B and 407B form a key definition set that identifies which portion of the source data selected by SELB will form the second segment of KEY_MOD.

Field 405C contains select bits (SELC) that select either a previous search key or a previous search result as source data to form the third segment 450C of KEY_MOD. Field 406C contains a first byte pointer (BPTC) that points to the first byte in the source data selected by SELC. Field 407C contains bits indicating the number of bytes (NBSC) of the selected source data that are to be used to form third segment 450C of KEY_MOD. Together, fields 406C and 407C form a key definition set that identifies which portion of the source data selected by SELC will form the third segment of KEY_MOD.

For some embodiments, a value of "00" of SEL selects the search key used in the first compare operation in CAM array 221 (i.e., the first key), a value of "01" of SEL selects the search key used in the most recent compare operation in CAM array 221 (i.e., the most recent key), a value of "10" for SEL selects the results of the first compare operation (i.e., the first results), and a value of "11" of SEL selects the results of the most recent compare operation (i.e., the most recent results).

Field 408 may be used to store instruction bits to implement other commands not defined by information contained in other fields of instruction 400.

Figure 5:
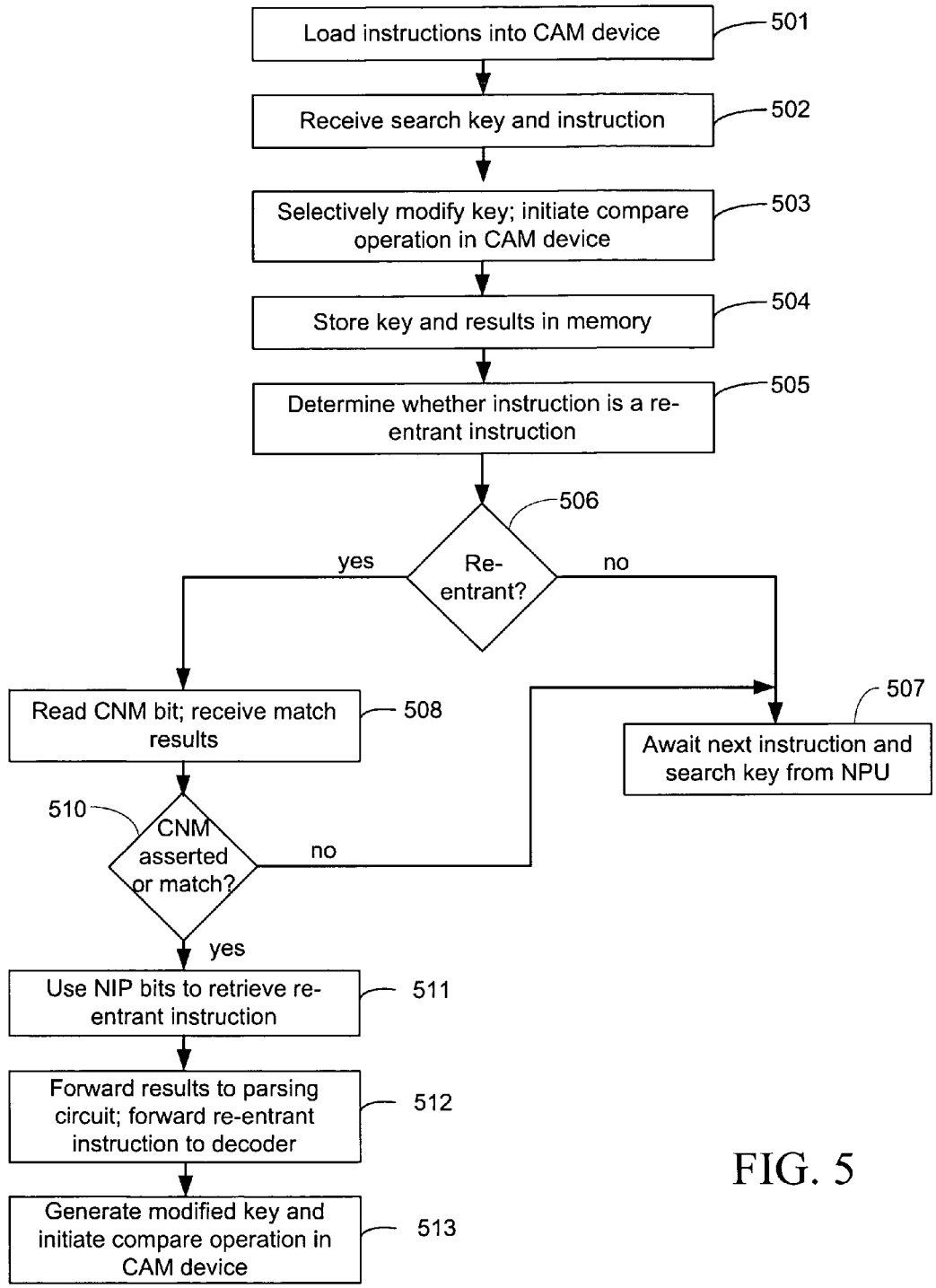
FIG. 5 shows an illustrative flow chart depicting an exemplary re-entrant search operation for one embodiment of FIG. 5.

An exemplary operation of CAM device 200 for performing a series of re-entrant search operations in response to a single instruction and search key received from network processor 110 is described below with respect to the illustrative flow chart of FIG. 5, with reference also being made to FIGS. 2, 3, 4A, and 4B. Initially, a number of re-entrant instructions INST_RE are stored in extended instruction buffer 312, and arbiter control circuit 303 initializes SEL_ARB to a de-asserted state (501). For some embodiments, the re-entrant instructions may be stored in extended instruction buffer 312 by a network administrator either prior to or during operation of CAM device 200 using well-known techniques. As mentioned above, a re-entrant instruction is an instruction that references another instruction (i.e., via the NIP) already stored in CAM device 200. In this manner, a single re-entrant instruction received from network processor 110 may be used to initiate any number of subsequent search operations in CAM array 221 using one or more modified search keys generated within CAM device 200 without receiving additional keys or instructions from network processor 110.

During operation of the network processing system, network processor 110 provides a first instruction (INST1) and an associated first search key (KEY1) to CAM device 200 (502). In response thereto, CAM device 200 may selectively modify the search key to generate a modified search key, and initiates a first compare operation in CAM array 221 (503).

For example, INST1 and KEY1 may be provided to arbiter logic 302, and request circuit 316 asserts REQA. Arbiter control circuit 303 arbitrates the request, and drives SEL_ARB to a first state. In response thereto, arbiter logic 302 provides INST1 to instruction decoder 308 and provides KEY1 to parsing circuit 310 and to key memory 304. In response to re-entrant information contained in INST1 and decoded by instruction decoder 308, parsing circuit 310 may selectively modify KEY1 to generate KEY_MOD for use in the compare operation. For exemplary purposes of discussion herein, INST1 causes parsing circuit 310 to not modify KEY1 for the current compare operation. However, for actual embodiments, INST1 may cause parsing circuit 310 to modify KEY1 to generate KEY_MOD in response to re-entrant information contained in INST1, for example, as described below with respect to 513. Instruction decoder 308 decodes INST1 to generate CAM control signals CTRL_CAM that initiate the compare operation between KEY1 and data stored in CAM array 221, and to generate parsing control signals CTRL_PC that parsing circuit 310 uses to generate NIP and SEL_RST. Priority encoder 206 uses match results from CAM array 221 to generate a first index (IDX1) in a well-known manner. IDX1 may then be used (i.e., as an address) to retrieve first output data (DOUT1) from associated memory 123.

For some embodiments, KEY may be a super-key that contains any number of individual key segments that may be selectively used as the search key for compare operations in CAM core 220.

The compare results (e.g., KEY1 and DOUT1) are stored in memories 304 and 306 (504). Then, CAM device 200 determines whether INST1 is a re-entrant instruction (505). For some embodiments, the NIP bits associated with INST1 may be compared with a predetermined (PV) value to determine if INST1 is a re-entrant instruction. For example, parsing circuit 310 may include a well-known comparator (not shown for simplicity) that compares NIP with PV to selectively enable the initiation of a series of re-entrant search operations in. CAM core 220. For some embodiments, PV may be stored in a suitable storage element (not shown for simplicity) within or coupled to re-entrant processor 300. For one embodiment, PV may be provided by network processor 110. For other embodiments, INST1 may contain an enabling bit that identifies whether INST1 is a re-entrant instruction. Further, although depicted in the illustrative flow chart of FIG. 5 as occurring after the compare results are stored in memory 306 context buffer 710, parsing circuit 310 may determine whether INST1 is a re-entrant instruction before the compare results are stored in memory 306.

If INST1 is not a re-entrant instruction, as tested at 506, CAM core 220 remains idle until a subsequent instruction and search key are provided to CAM device 200 by network processor 110 (507). For some embodiments, the match between NIP and PV may prevent KEY1 from being written into key memory 304 and/or may prevent DOUT1 from being written into result memory 306. Further, the match between NIP and PV may cause DOUT1 to be provided to network processor 110 via signal lines 102 (see also FIG. 2).

Conversely, if INST1 is a re-entrant instruction, as tested at 506, parsing circuit 310 receives the match results (e.g., such as the match flag) from CAM core 220 and examines the CNM bit associated with INST1 (508).

If there is not a match condition for the compare operation initiated by INST1 and the CNM bit is not asserted, as tested as 510, parsing circuit 310 does not initiate any re-entrant search operations, and CAM device 200 awaits the next instruction and search key from network processor 110 (507).

Conversely, if there is a match condition or if the CNM bit is asserted, then a re-entrant search operation may be initiated, as described below. First, the NIP bits are used to select a re-entrant instruction (e.g., INST_RE1) from extended instruction buffer 312 (511). For example, the NIP bits are routed from the CAM core's pipeline (or alternately from parsing circuit 310) to extended instruction buffer 312 and used as an address to read INST_RE1 from extended instruction buffer 312.

Request circuit 317 buffers DATA_RE and INST_RE, and asserts REQB. Arbiter control circuit 303 arbitrates the requests, and asserts SEL_ARB to a second state, which causes arbiter logic 302 to forward DATA_RE to parsing circuit 310 and to forward INST_RE1 to instruction decoder 308 (512). Instruction decoder 308 decodes INST_RE1 to generate CAM control signals CTRL_CAM that initiate a compare operation in CAM array 221, and to generate parsing control signals CTRL_PC for parsing circuit 310. In response to INST_RE1, parsing logic 310A generates a re-entrant search key as KEY_MOD using data extracted from one or more previous search keys and/or one or more previous search results, which may be received from arbiter logic 302 as DATA_RE and stored in buffers 310B (513).

For example, as described above with respect to FIGS. 4A-4B, INST_RE1 may include re-entrant data fields 405A-407A to 405C-407C, where fields 405A-407A identifies the source data and defines the construction of first segment 450A of KEY_MOD, fields 405B-407B identifies the source data and defines the construction of second segment 450B of KEY_MOD, and fields 405C-407C identifies the source data and defines the construction of third segment 450C of KEY_MOD. Thus, for some embodiments, SELA may be used to select a previous key or result from buffers 310B to be used to form the first segment 450A of KEY_MOD, and BPTA and NBSA may be used to define how the source data identified by SELA is used to form the first segment 450A of KEY_MOD. Similarly, SELB may be used to select a previous key or result from buffers 310B to be used to form the second segment 450B of KEY_MOD, and BPTB and NBSB may be used to define how the source data identified by SELB is used to form the second segment 450B of KEY_MOD. Similarly, SELC may be used as an address to select a previous key or result from buffers 310B to be used to form the third segment 450C of KEY_MOD, and BPTC and NBSC may be used to define how the source data identified by SELC is used to form the third segment 450C of KEY_MOD.

Next, parsing circuit 310 forwards the re-entrant search key (KEY_MOD) to CAM core 220, and also provides the NIP and SEL_RST from INST_RE1 to the CAM core pipeline. Instruction decoder 308 decodes INST_RE1 to generate CAM control signals CTRL_CAM that initiate a compare operation between the re-entrant search key and data stored in CAM array 221. Thereafter, re-entrant information contained in INST_RE1 may be used to initiate another compare operation using another modified (i.e., re-entrant) search key, for example, by selecting another re-entrant instruction stored in extended instruction buffer 312. This process may be performed any number of times until the re-entrant sequence is terminated. As mentioned above, the re-entrant sequence may be terminated when either (1) the NIP in a subsequent instruction is set to PV or (2) the CNM bit of a subsequent instruction is de-asserted and there is a mismatch condition in CAM array 221.

Further, although not shown in FIG. 3, result memory 306 may include an output coupled to network processor 110 so that the immediate results of one or more re-entrant searches may be provided to network processor 110 as the results become available from CAM core 220, for example, as indicated by the return code (RTN) bits.

Figure 6:
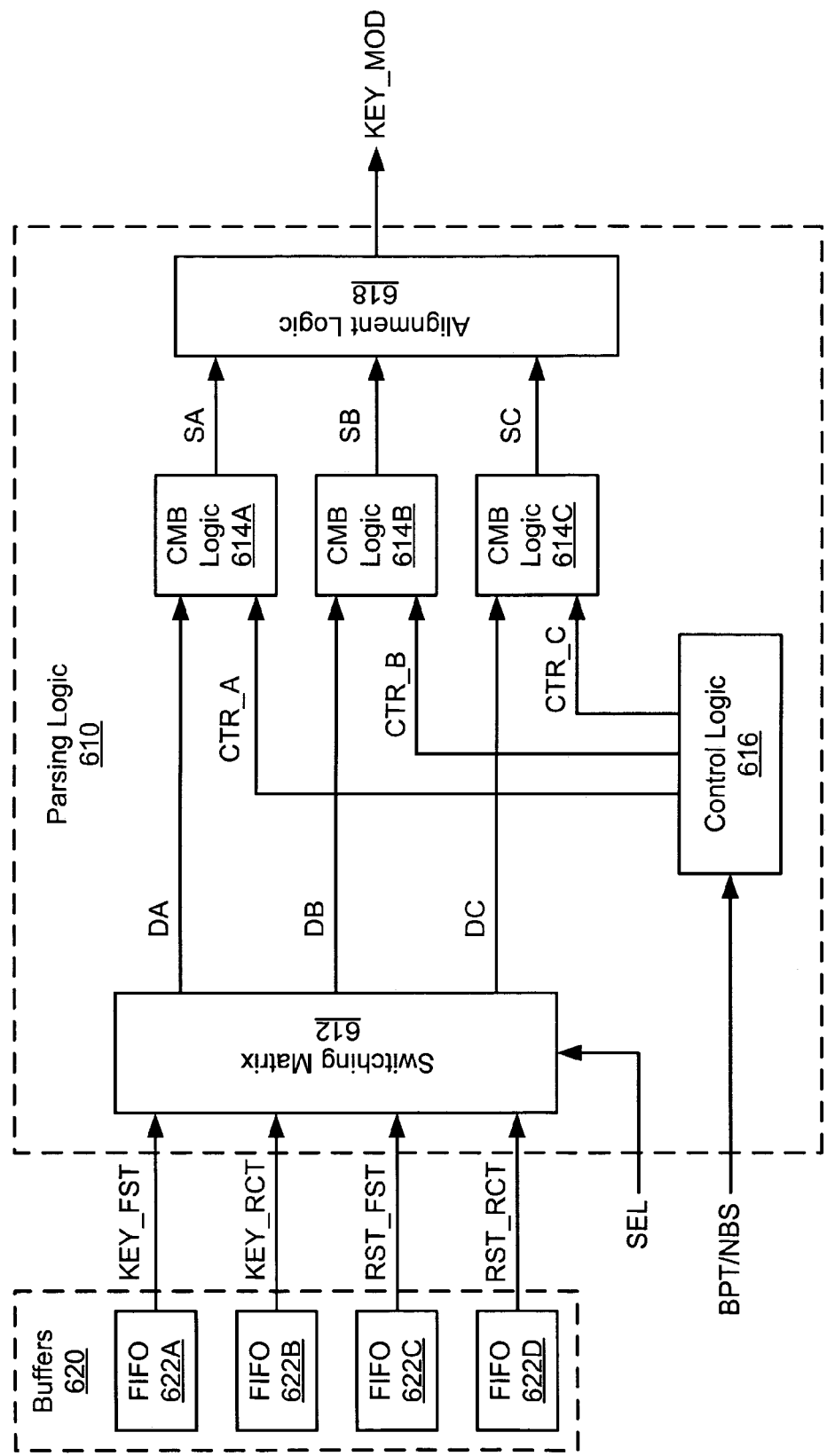
FIG. 6 is a simplified functional block diagram of one embodiment of the parsing logic of FIG. 3.

FIG. 6 shows a simplified functional block diagram of parsing logic 601 that is one embodiment of parsing logic 310A of FIG. 3. Parsing logic 610 is coupled to buffers 620, which are one embodiment of buffers 310B of FIG. 3. Buffers 620 are shown to include four FIFO memories 622A-622D, which store the first key (KEY_FST), the most recent (KEY_RCT), the first compare results (RST_FST), and the last compare results (RST_RCT), respectively. For other embodiments, buffers 620 may include other FIFO memories to store keys and/or results from other compare operations performed in CAM core 220 (e.g., from other than the first and last compare operations).

Parsing logic 610 includes a switching matrix 612, combination logic circuits 614A-614C, control logic 616, and alignment logic 618. Switching matrix 612, which may include well-known switching circuitry such as a cross-bar circuit, includes inputs to receive KEY_FST, KEY_RCT, RST_FST, and RST_RCT, a control input to receive SELA-SELC (represented collectively as SEL in FIG. 6), and outputs to provide source data (DA-DC) for constructing segments (SA-SC) of KEY_MOD. Each of combination logic circuits 614A-614C includes a first input to receive corresponding data (DA-DC) from buffers 620, a second input to receive a corresponding control signal CTR_A-CTR_C from control logic 616, and an output to generate a corresponding segment SA-SC for constructing KEY_MOD. Control logic 616 includes an input to receive BPTA-BPTC (represented collectively as BPT in FIG. 6) and to receive NBSA-NBSC (represented collectively as NBS in FIG. 6), and includes outputs to generate CTR_A-CTR_C. Alignment logic 618 includes inputs to receive SA-SC, and includes an output to generate KEY_MOD.

An exemplary operation of parsing logic 610 and buffers 620 is as follows. During execution of a re-entrant instruction (INST_RE), buffers 620 forward KEY_FST, KEY_RCT, RST_FST, and RST_RCT to switching matrix 612, the select signals SEL are provided from INST_RE to switching matrix 612, and re-entrant signals BPT and NBS are provided from INST_RE to control logic 616. In response to the select signals SEL, switching matrix 612 selectively forwards KEY_FST, KEY_RCT, RST_FST, and RST_RCT as source data DA-DC to combination logic circuits 614A-614C, respectively. For example, SELA determines whether switching matrix 612 forwards KEY_FST, KEY_RCT, RST_FST, or RST_RCT as source data DA to combination logic circuit 614A, SELB determines whether switching matrix 612 forwards KEY_FST, KEY_RCT, RST_FST, or RST_RCT as source data DB to combination logic circuit 614B, and SELC determines whether switching matrix 612 forwards KEY_FST, KEY_RCT, RST_FST, or RST_RCT as source data DC to combination logic circuit 614C.

Then, in response to respective control signals CTR_A-CTR_C, combination logic circuits 614A-614C determines which portions of corresponding source data DA-DC are used to form segments SA-SC, respectively of KEY_MOD. For example, CTR_A, which includes information indicative of BPTA and NBSA, instructs combination logic circuit 614A which portions of DA to use in constructing SA. Similarly, CTR_B, which includes information indicative of BPTB and NBSB, instructs combination logic circuit 614B which portions of DB to use in constructing SB, and CTR_C, which includes information indicative of BPTC and NBSC, instructs combination logic circuit 614C which portions of DC to use in constructing SC. For some embodiments, combination logic circuits 614A-614C may be implemented using well-known parsing techniques.

Alignment logic 618 is configured to align the bit patterns of data segments SA-SC to form a contiguous bit pattern for KEY_MOD that may be provided to CAM core 220 for a compare operation with data stored in CAM array 221. For example, because the individual bit lengths of SA-SC may vary within and/or between re-entrant search operations, alignment logic 618 ensures that the resultant bit pattern for KEY_MOD does not contain any vacant bits between data segments SA-SC. The functions of alignment logic 618 may be implemented using well-known circuit techniques. For some embodiments, alignment logic 618 may be configured to concatenate data segments SA-SC together to form KEY_MOD.

Figure 7:
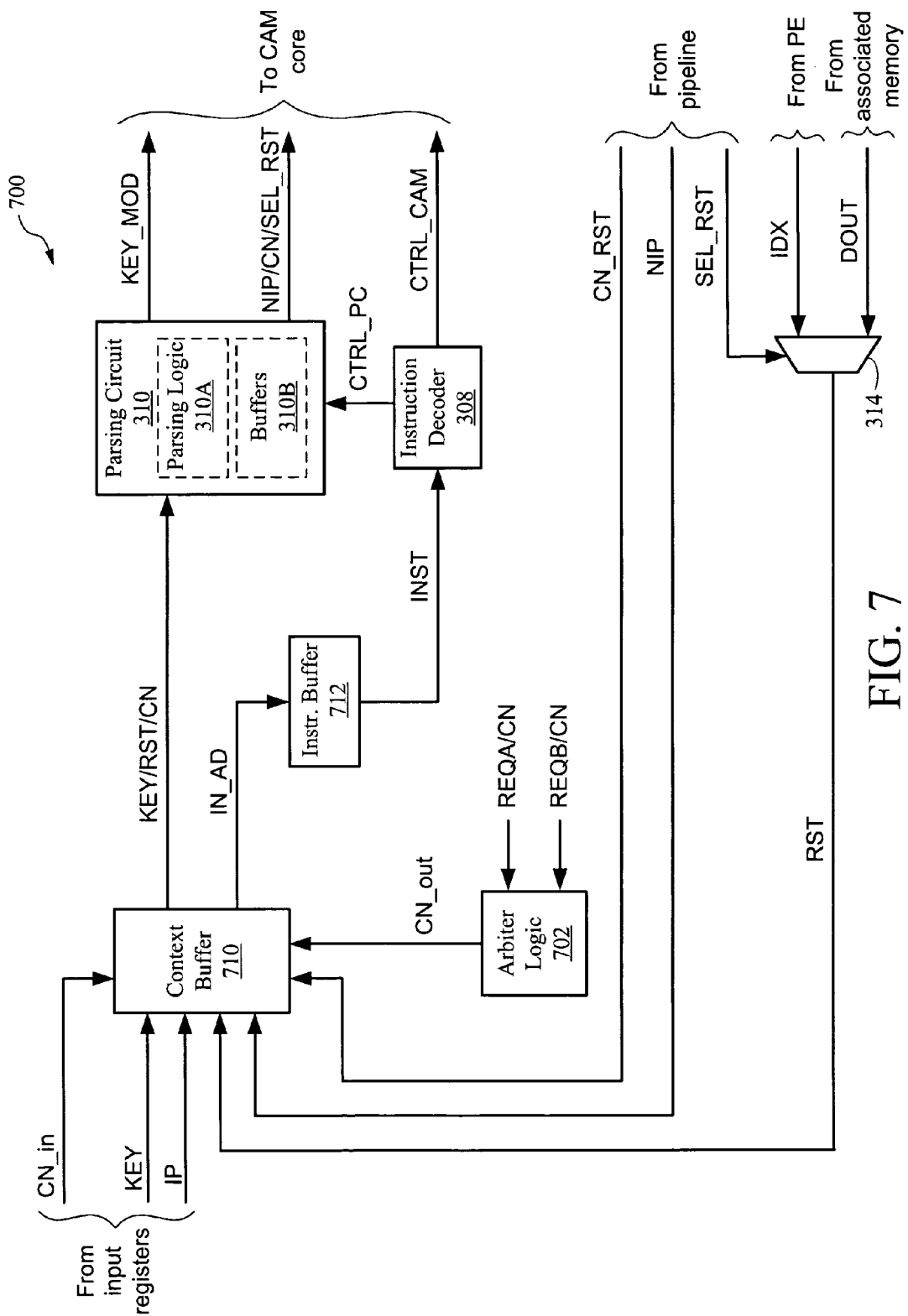
FIG. 7 is a functional block diagram of another embodiment of the re-entrant processor of FIG. 3.

As mentioned above, for other embodiments, key memory 304 and result memory 306 may be replaced by a context buffer that allows key and result information from current and/or previous compare operations to be individually addressed using information contained in the instructions provided to the CAM core. For some embodiments, a set of keys, results, and/or instructions for a context may be assigned a context number, where the context may correspond to an item (e.g., such as a network data packet) to be processed by re-entrant processor 700. For example, FIG. 7 shows a functional block diagram of a re-entrant processor 700 that is another embodiment of re-entrant processor 210 of FIG. 2. Re-entrant processor 700, which is similar to re-entrant processor 300 of FIG. 3, includes instruction decoder 308, parsing circuit 310, MUX 314, arbiter logic 702, a context buffer 710, and an instruction buffer 712. It is to be noted that the specific layout of components depicted in FIG. 7 is merely illustrative and is referenced below for explaining operation of another exemplary embodiment of re-entrant processor 210. Thus, for other embodiments, the various components of re-entrant processor 700 may be arranged in other configurations, and/or may include other suitable components to implement the re-entrant search and key modification functions described below.

Arbiter logic 702 includes inputs to receive REQA and REQB, which for exemplary embodiments of FIG. 7 also include a corresponding context number (CN), and includes an output to generate an output context number (CN_out). Arbiter logic 702, which may be implemented using well-known circuit techniques, may use any suitable arbitration technique (e.g., such as fixed, round robin, weighed fair queuing, and so on) to arbitrate between requests REQA and REQB. For some embodiments, arbiter logic 702 may be configurable (e.g., by a network administrator) to select one of a multitude of arbitration techniques. For one embodiment, a feedback signal (not shown for simplicity) may cause arbiter logic 702 to halt current operations, for example, in response congestion in the CAM core pipeline. For simplicity, the request circuits that generate REQA and REQB are not shown in FIG. 7.

Context buffer 710 has a first input to receive KEY from network processor 110, a second input to receive an instruction pointer (IP) from network processor 110, a third input to receive compare results (RST) from MUX 314, a fourth input to receive NIP from the CAM pipeline, a first write control terminal to receive an input context number (CN_in) from network processor 110, a second write control terminal to receive a result context number (CN_RST) from the CAM pipeline, a read control terminal to receive CN_out from arbiter logic 702, first outputs to provide KEY, RST, and CN to parsing circuit 310, and second outputs to provide an instruction address (IN_AD) to instruction buffer 712. Context buffer 710 includes a plurality of storage locations (not shown in FIG. 7) each for storing key, result, and instruction information associated with a particular context. CN_in or CN_RST may be used as a write address to write key, result, and/or instruction information for a particular context to a corresponding location of context buffer 710. CN_out may be used as a read address to retrieve key, result, and/or instruction information for a particular context from a corresponding location of context buffer 710.

Figure 8:
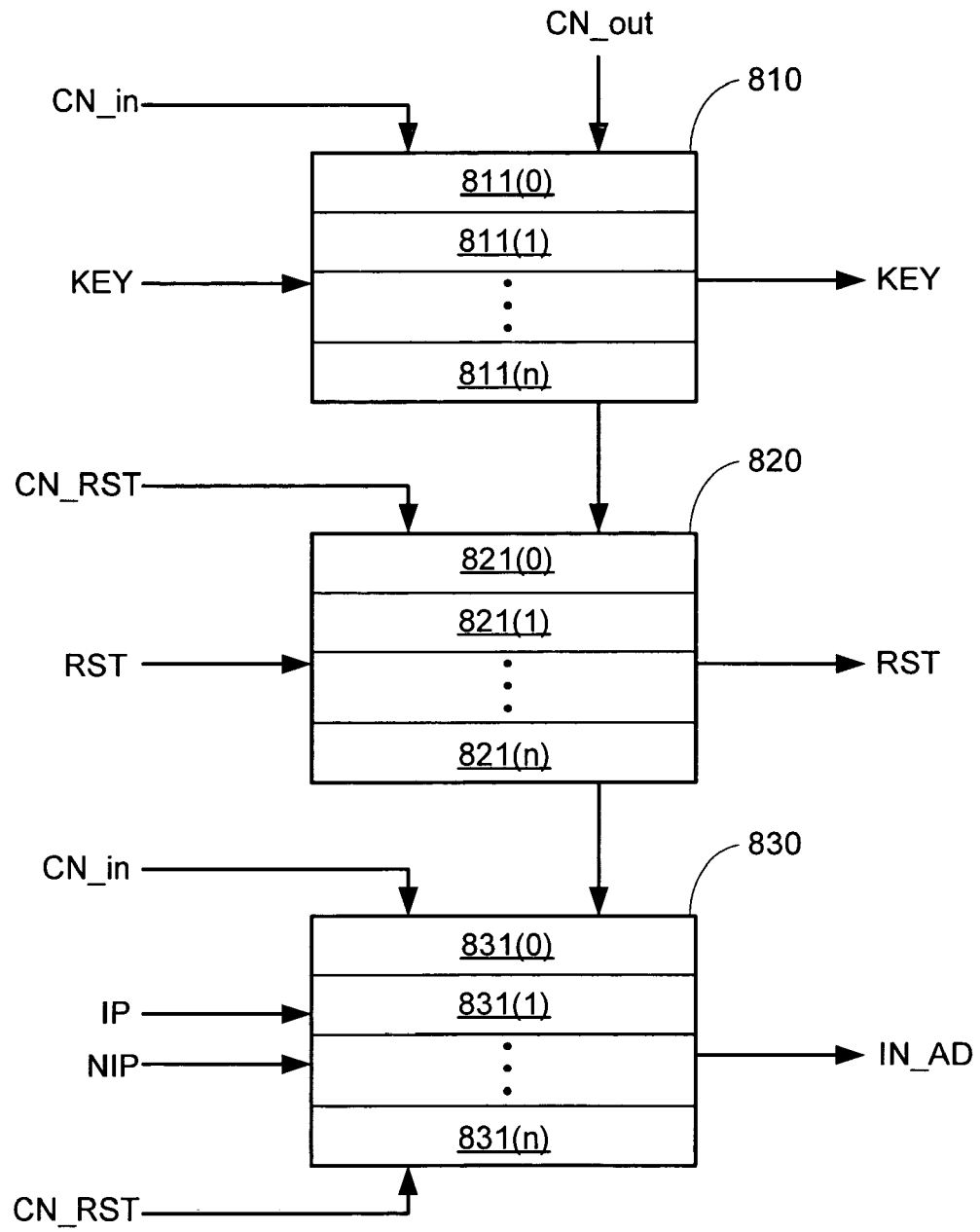
FIG. 8 is a functional block diagram of an exemplary embodiment of the context buffer utilized by the re-entrant processor of FIG. 7.

Context buffer 710 may be any suitable addressable storage device such as, for example, a look-up table, SRAM, DRAM, and the like, and may be of any suitable configuration. For example, FIG. 8 is a functional block diagram of a context buffer 800 that is one embodiment of context buffer 710 of FIG. 7. Context buffer 800 is shown to include addressable buffers 810, 820, and 830. Buffer 810, which includes an input to receive KEY, a write control terminal to receive CN_in, a read control terminal to receive CN_out, and an output coupled to parsing circuit 310, is a dual-ported SRAM device having a plurality of storage locations 811(0)-811(n) each for storing a KEY for a corresponding context. Buffer 820, which includes an input to receive RST, a write control terminal to receive CN_RST, a read control terminal to receive CN_out, and an output coupled to parsing circuit 310, is a dual-ported SRAM device having a plurality of storage locations 821(0)-821(n) each for storing a RST for a corresponding context. Buffer 830, which includes a first input to receive IP, a second input to receive NIP, a first write terminal to receive CN_in, a second write control terminal to receive CN_RST, a read control terminal to receive CN_out, and an output coupled to instruction buffer 712, is a three-ported SRAM device having a plurality of storage locations 831(0)-831(n) each for storing an instruction pointer (e.g., either IP or NIP) for a corresponding context. Corresponding rows of buffers 810, 820, and 830 have similar addresses so that a single address may be used to simultaneously access a corresponding row in each of buffers 810, 820, and 830. For example, providing a CN_out=0 may be used to simultaneously access row 811(0) of buffer 810, row 821(0) of buffer 820, and row 831(0) of buffer 830 so that key information stored in buffer 810, result information stored in buffer 820, and instruction information stored in buffer 830 may be simultaneously output for processing the context identified by CN_out=0. Of course, for other embodiments, buffers 810, 820, and 830 may be other suitable types of addressable memories.

Figure 9:
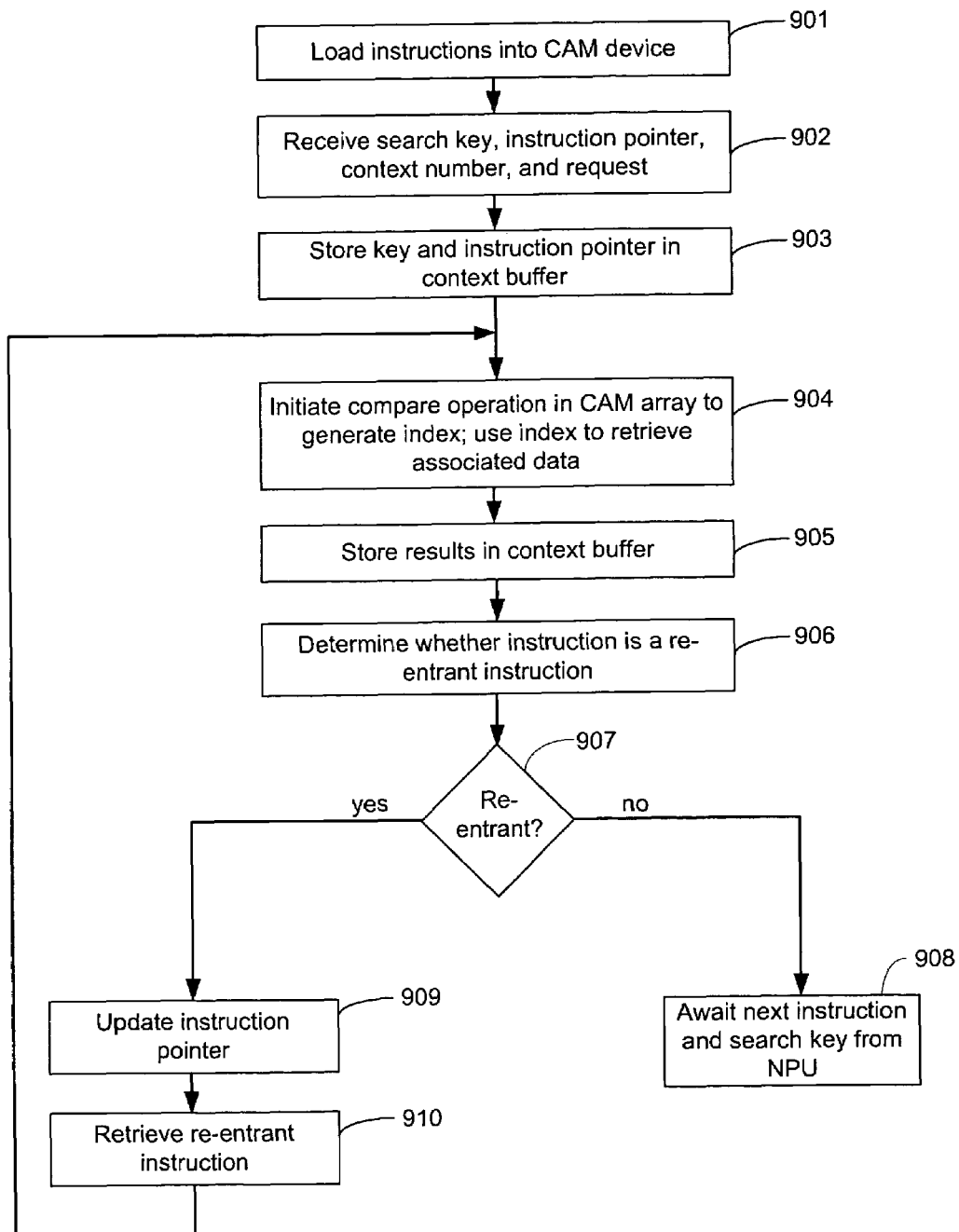
FIG. 9 shows an illustrative flow chart depicting an exemplary re-entrant search operation for one embodiment of FIG. 7.

An exemplary operation of re-entrant processor 700 of FIG. 7 is described below with respect to the illustrative flow chart of FIG. 9, with reference also being made to FIGS. 2, 3, 7 and 9. Initially, a number of instructions are stored in instruction buffer 712 (901). For some embodiments, the instructions may be stored in instruction buffer 712 by a network administrator either prior to or during operation of the CAM device using well-known techniques. During operation of the network processing system, network processor 110 provides an initial search key (KEY1), an instruction pointer (IP1), and a corresponding context number (CN_in1) to re-entrant processor 700, and issues a request (REQA) to arbiter logic 702 (902). For embodiments described herein, the request also includes CN_in. Next, the key and instruction pointer are stored in context buffer 710 (903). More specifically, CN_in is used as write address to write KEY1 and IP1 into a corresponding storage location (e.g., location 0) in context buffer 710.

Then, a compare operation is initiated between the search key and data stored in CAM array 221 to generate an index (IDX) of the highest priority match, which in turn may be used to retrieve associated data from associated memory 123 (904). More specifically, arbiter logic 702 forwards CN_in as CN_out to context buffer 710, which in response thereto outputs KEY1 and CN to parsing circuit 310 and outputs IP as IN_AD to instruction buffer 712. The instruction (e.g., INST1) identified by IN_AD is provided to instruction decoder 308, which decodes the instruction to generate CAM control signals CTRL_CAM and parsing control signals CTRL_PC. As described above with respect to FIGS. 3 and 5, CTRL_CAM are used to initiate the compare operation in CAM array 221, and CTRL_PC are used by parsing circuit 710 to (1) selectively modify KEY1 to generate a modified key (KEY_MOD) for use in the compare operation and (2) to selectively initiate subsequent execution of one or more re-entrant instructions without receiving additional data and/or instructions from network processor 110. Parsing circuit 310 provides the search key (either modified or unmodified) to CAM array 221, and also forwards NIP, CN, and SEL_RST to the CAM pipeline.

After the compare operation is completed in CAM array 221 and associated data is retrieved from associated memory 123, the results (RST) are stored in context buffer 710 (905). More specifically, IDX1 and/or DOUT1 are provided as RST, and CN_RST is used as a write address to store RST in the storage location in context buffer 710 associated with the context. Note that CN_RST is provided as the write address for RST because the network processor 110 may have made a subsequent request to process another context, in which case the current value of CN_in may be different from the value of CN_RST. In this manner, the compare results for a context are stored in the same context buffer location as the key and instruction information for the context.

CAM device 200 also determines whether the instruction is a re-entrant instruction, for example, by comparing the NIP extracted from the decoded instruction to a predetermined value, as described above with respect to FIGS. 3 and 5 (906). Although depicted in the illustrative flow chart of FIG. 9 as occurring after the compare results are stored in context buffer 710, parsing circuit 310 may determine whether INST1 is a re-entrant instruction before the compare results are stored in context buffer 710.

If the instruction is not a re-entrant instruction, as tested as 907, the CAM device may remain idle until a subsequent instruction and search key are received from the network processor (908).

Conversely, if the instruction is a re-entrant instruction, re-entrant processor 700 may initiate a series of subsequent compare operations without receiving additional data and/or instructions from the network processor, as follows. First, the instruction pointer stored in context buffer 710 for the associated context is updated with NIP (909). More specifically, CN_RST is used as a write address to store NIP into the context buffer location (e.g., location 0) for the context, thereby replacing the previous IP value with NIP. Then, the re-entrant instruction is retrieved to initiate a subsequent compare operation (910). More specifically, arbiter logic 702 provides the previous value of CN_out as a read address to context buffer 710, which in response thereto forwards key, result, and context number information to parsing circuit 310 and forwards NIP to instruction buffer 712. Thereafter, the re-entrant instruction identified by NIP is used to selectively generate a new (re-entrant) search key and to initiate a subsequent compare operation in the CAM core, which may be executed in the manner described above with respect to 904-910.

Using context buffer 710 to store key and result information for corresponding contexts pipelined in the CAM core allows various sets of key and result information to be randomly accessed and retrieved from the context buffer during operation of the CAM system, which in turn may enable re-entrant processor 700 to execute instructions in an out-of-order manner. Further, the ability to store key and result information for a plurality of contexts allows for greater flexibility in retrieving previous key and result information for use by parsing circuit 310 to generate KEY_MOD.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, the particular order in which the functions depicted in the illustrative flow charts of FIGS. 5 and 9 are exemplary; for actual embodiments, the order in which the functions performed by re-entrant processors of the present invention may be different from that described above.

What is claimed is:

1. A content addressable memory (CAM) device, comprising:
   a CAM core including a CAM array having a plurality of rows of CAM cells, each row for storing a corresponding data word;
   circuitry for generating a result in response to a compare operation between a search key and the data words stored in the CAM array; and
   a re-entrant processor configured to selectively modify the search key by replacing selected portions of the search key with selected portions of one or more previous search keys and/or with selected portions of one or more previous results, wherein the compare operation is initiated by an initial instruction comprising key construction data that defines modification of the search key, wherein the key construction data comprises:
   a plurality of select bits sets, each select bit set for selecting one of the previous search keys or one of the previous results as source data for constructing a corresponding segment of a modified search key; and
   a plurality of key definition data sets, each key definition data set for determining which portion of the corresponding source data forms the corresponding segment of the modified search key.

2. The CAM device of claim 1, wherein the result comprises an index of the highest priority match in the CAM array and/or associated data retrieved from an associated memory device in response to the index.

3. The CAM device of claim 1, wherein the initial instruction is received from an external network processor.

4. The CAM device of claim 1, wherein the re-entrant processor comprises:
   a number of buffers for storing the source data; and
   parsing logic coupled to the buffers and configured to generate the modified search key from the source data in response to the key construction data sets.

5. The CAM device of claim 4, wherein the parsing logic comprises:
   a switching matrix having a number of inputs coupled to the buffers and configured to output selected sets of source data in response to the select bit sets;
   a control circuit configured to generate a number of control signals in response to the key definition data sets;
   a number of combination logic circuits each coupled to the switching matrix and configured to output a selected portion of the corresponding source data as a modified search key segment in response to a corresponding control signal; and
   alignment logic having inputs to receive the modified search key segments from the combination logic circuits and configured to align the modified search key segments to generate the modified search key.

6. The CAM device of claim 1, wherein the re-entrant processor is further configured to initiate a series of subsequent compare operations between a number of re-entrant search keys and the data words stored in the CAM array without receiving additional instructions or additional search keys from the network processor.

7. The CAM device of claim 6, wherein the re-entrant search keys are different from each other.

8. The CAM device of claim 6, wherein the re-entrant processor comprises:
   an instruction buffer for storing one or more re-entrant instructions, wherein each re-entrant instruction initiates a corresponding one of the subsequent compare operations.

9. The CAM device of claim 8, wherein the initial instruction further comprises a first next instruction pointer that identifies a first of the re-entrant instructions stored in the instruction buffer.

10. The CAM device of claim 9, wherein each re-entrant instruction comprises:
    a second next instruction pointer that identifies another of the re-entrant instructions stored in the instruction buffer; and
    key construction data that defines how a corresponding one of the re-entrant search keys is to be constructed using selected portions of the previous search keys and/or selected portions of the previous results.

11. The CAM device of claim 10, wherein the re-entrant processor further comprises a context buffer having a plurality of storage locations, each for storing key, result, and instruction information for a corresponding context to be processed in the CAM device.

12. A network processing system, comprising:
    a network processor; and
    a content addressable memory (CAM) device, comprising:
       a CAM core including a CAM array having a plurality of rows of CAM cells, each row for storing a corresponding data word, where the CAM core further comprises circuitry for generating a result in response to each compare operation; and
       a re-entrant processor coupled to the network processor and to the CAM core, and configured to initiate a series of compare operations between a plurality of unique search keys and the data words stored in the CAM array in response to a single command provided by the network processor, wherein the re-entrant processor comprises:
          an instruction buffer having a plurality of storage locations, each for storing an instruction that initiates a corresponding one of the series of compare operations; and a context buffer having a number of storage locations, each for storing the search key, the results, and an instruction pointer for a corresponding context to be processed in the CAM device, wherein each instruction pointer identifies a corresponding instruction stored in the instruction buffer.

13. The CAM device of claim 12, wherein the result comprises an index of the highest priority match in the CAM array and/or associated data retrieved from an associated memory device in response to the index.

14. The CAM device of claim 12, wherein each context corresponds to a data packet to be routed by the network processor.

15. The system of claim 12, wherein the context buffer further comprises:
a write control terminal to receive an input context number; and
a read control terminal to receive an output context number, wherein the input context number is provided by the network processor and the output context number is provided by arbiter logic coupled to the context buffer.

16. The system of claim 12, wherein the re-entrant processor further comprises:
a parsing circuit having a first input coupled to the context buffer, a second input to receive decoded instructions, and an output coupled to the CAM core.

17. The system of claim 16, wherein for each context the parsing circuit is configured to construct a new search key using selected portions of the search key and/or selected portions of the results stored in a corresponding storage location of the context buffer.

18. The system of claim 17, wherein the parsing circuit constructs the new search key according to key construction data contained in the instruction identified by the instruction pointer stored in the corresponding storage location of the context buffer.

19. The CAM device of claim 12, wherein each instruction includes a next instruction pointer that identifies another instruction stored in the instruction buffer.

20. The CAM device of claim 19, wherein after each compare operation associated with a particular context, the instruction pointer stored in the corresponding storage location of the context buffer is replaced by the next instruction pointer contained in the instruction that initiated the compare operation.

21. The CAM device of claim 16, wherein the parsing logic comprises:
a switching matrix having inputs to receive the search key and the results for a selected context and having a number of outputs each for providing a selected search key or a selected one of the results in response to a corresponding select signal;
a number of combination logic circuits, each having a first input coupled to a corresponding output of the switching matrix, a second input to receive a corresponding combination control signal, and output to provide a corresponding segment of an associated one of the unique search keys; and
control logic having an input to receive a key definition data set and having a number of outputs to generate the combination control signals.

22. The system of claim 21, wherein the instruction comprises the select signals and the key definition data set.

23. A method of operating a content addressable memory (CAM) device including a CAM array, the method comprising:
loading an initial instruction and an initial search key from external processor into the CAM device;
selectively modifying the initial search key using portions of one or more previous search keys and/or one or more previous search results, wherein the initial instruction comprises key construction data that defines modification of the search key;
executing a compare operation between the selectively modified search key and data words stored in the CAM array in response to the initial instruction; and
initiating a series of subsequent compare operations between a plurality of new search keys and the data word stored in the CAM array without receiving additional instructions or search keys from the external processor, wherein the initiating comprises:
pre-loading a plurality of re-entrant instructions in the CAM device;
extracting a next instruction pointer from the initial instruction;
selectively retrieving the re-entrant instruction identified by the next instruction pointer; and
executing the subsequent compare operation in response to the selected re-entrant instruction.

24. The method of claim 23, further comprising:
generating a current result in response to the compare operation; and
storing the initial search key and the current result in a memory provided within the CAM device.

25. The method of claim 23, wherein the selectively modifying comprises:
extracting key definition data from the initial instruction; and
for each of a number of segments of the selectively modified search key:
selecting one of the previous search keys or previous results as source data; and
forming the segment using data from the selected source data.

* * * * *